(12) United States Patent
Miao et al.

(10) Patent No.: US 11,342,695 B2
(45) Date of Patent: May 24, 2022

(54) CABLE CONNECTION APPARATUS, CONNECTION ASSEMBLY, AND METHOD FOR MANUFACTURING CONNECTION ASSEMBLY

(71) Applicant: SHENNAN CIRCUITS CO., LTD., Shenzhen (CN)

(72) Inventors: Hua Miao, Shenzhen (CN); Guodong Wang, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 0 days.

(21) Appl. No.: 17/090,918

(22) Filed: Nov. 6, 2020

(65) Prior Publication Data
US 2021/0367359 A1   Nov. 25, 2021

Related U.S. Application Data

(63) Continuation of application No. PCT/CN2020/092141, filed on May 25, 2020.

(51) Int. Cl.
*H01R 12/70*   (2011.01)
*H01R 12/59*   (2011.01)

(52) U.S. Cl.
CPC ......... *H01R 12/707* (2013.01); *H01R 12/598* (2013.01); *H01R 12/7041* (2013.01)

(58) Field of Classification Search
None
See application file for complete search history.

(56) References Cited

FOREIGN PATENT DOCUMENTS

| CN | 101048034 A | 10/2007 |
|----|-------------|---------|
| CN | 101330172 A | 12/2008 |
| CN | 102544795 A | 7/2012 |
| JP | 2000348826 A | 12/2000 |

OTHER PUBLICATIONS

Liu Yuanzhi et al. Practice of improving the reliability of hard connection in electronic product manufacturing ISSN:101-3474 pp. 152-155.
International Search Report issued in corresponding International application No. PCT/CN2020/092141, dated Mar. 1, 2021(8 pages).

*Primary Examiner* — Ross N Gushi

(57) ABSTRACT

A cable connection apparatus, a connection assembly, and a method for manufacturing the connection assembly are provided. The cable connection apparatus includes: a back plate and a connection member. The back plate includes a plate body and a ground layer. The plate body defines a through hole and a plurality of shielding holes. The plurality of shielding holes are defined at a periphery of the through hole. The ground layer is arranged on each of two opposite sides of the plate body and is connected to each of the plurality of shielding holes. The connection member abuts against or connects to a surface of a side of the back plate arranged with the ground layer. The connection member is arranged with a signal pin, and the signal pin is received in the through hole.

20 Claims, 4 Drawing Sheets

US 11,342,695 B2

CABLE CONNECTION APPARATUS, CONNECTION ASSEMBLY, AND METHOD FOR MANUFACTURING CONNECTION ASSEMBLY

CROSS-REFERENCE TO RELATED APPLICATIONS

The present application is a continuation-application of International (PCT) Patent Application No. PCT/CN2020/092141 filed on May 25, 2020, and the entire contents of which are hereby incorporated by reference in its entirety.

TECHNICAL FIELD

The present disclosure generally relates to the technical field of cable connection, and in particular to a cable connection apparatus, a connection assembly, and a method for manufacturing the connection assembly.

BACKGROUND

As high-speed communication develops, an increased number of applications involve coaxial cables, which are arranged in a same cabinet, communicating with each other. Meanwhile, high-speed electric transmission in an etched line-based printed circuit board (PCB) may be affected by a high-speed transmission loss and shaking. Therefore, cable interconnection within a board has been developed. Two plugging mechanisms may be arranged at two ends of a conventional cable for transmitting a high-speed signal through the cable. In this way, the cable may be easily connected to the PCB. However, there may be a signal loss while transmitting in high speed, and the plugging mechanism may have a complicated structure and a high manufacturing cost. Especially, when being arranged with a complicated structured PCB, a bundled of cables may be difficult to be plugged in and out. Further, a weight of the bundle of cables may increase a risk of the bundle of cables falling off from the PCB. Therefore, it may be essential to provide a connection apparatus for an interconnection system of a cable transmitting a high-speed signal.

SUMMARY OF THE DISCLOSURE

According to a first aspect of the present disclosure, a cable connection apparatus is provided and includes a back plate and a connection member. The back plate includes a plate body and a ground layer. The plate body defines a through hole and a plurality of shielding holes, the plurality of shielding holes are defined adjacent to and along a wall of the through hole, the ground layer is arranged on each of two opposite sides of the plate body and is connected to a wall of each of the plurality of shielding holes. The connection member is arranged to abut against or connect to one of the two opposite sides of the back plate arranged with the ground layer. The connection member is arranged with a signal pin, and a portion of the signal pin is received in the through hole.

According to a second aspect of the present disclosure, a connection assembly is provided and includes a high speed daughter card; a connection member; a back plate; a plurality of first cables and a first fixing member. The connection member is arranged with a signal pin. A side of the connection member is fixedly connected to the high speed daughter card, and the signal pin is connected to the high speed daughter card. The back plate is arranged on a side of the connection member away from the high speed daughter card. The back plate includes a plate body and a ground layer, the plate body defines a through hole and a plurality of shielding holes, the plurality of shielding holes are defined adjacent to or along a wall of the through hole, and the ground layer is arranged on each of two opposite sides of the plate body and is connected to a wall of each of the plurality of shielding holes. The first fixing member is arranged on a side of the back plate, the first fixing member defines a first through hole corresponding to the through hole in the back plate, and a diameter of the first through hole is adapted to a diameter of each of the plurality of first cables. The plurality of first cables are fixed with the first fixing member, and an end of each of the plurality of first cables is exposed on a surface of the first fixing member. The exposed end of each of the plurality of first cables is connected to the signal pin. The side of the connection member away from the high speed daughter card is arranged to abut against or connect to one of the two opposite sides of the back plate arranged with the ground layer. A portion of the signal pin is received in the through hole.

According to a third aspect of the present disclosure, a connection assembly is provided and includes: providing a plurality of first cables, a first fixing plate, a back plate, and a connection member engaging with the plurality of first cables, wherein the connection member is arranged with a signal pin, the back plate defines a through hole and is arranged with a ground layer, the first fixing plate defines a first through hole; arranging each of the plurality of first cables to extend through the first through hole, fixing each of the plurality of first cables with the first fixing plate, wherein an end of each of the plurality of first cables is exposed on a first surface of the first fixing plate; connecting the connection member with the back plate to enable an end of the signal pin protruded from the connection member is received in the through hole; connecting the first surface of the first fixing plate with a surface of the back plate away from the connection member; and fixing the high speed daughter card on a surface of the connection member exposing the other end of the signal pin to enable the signal pin to connect to the high speed daughter card.

DETAILED DESCRIPTION

Figure 1:
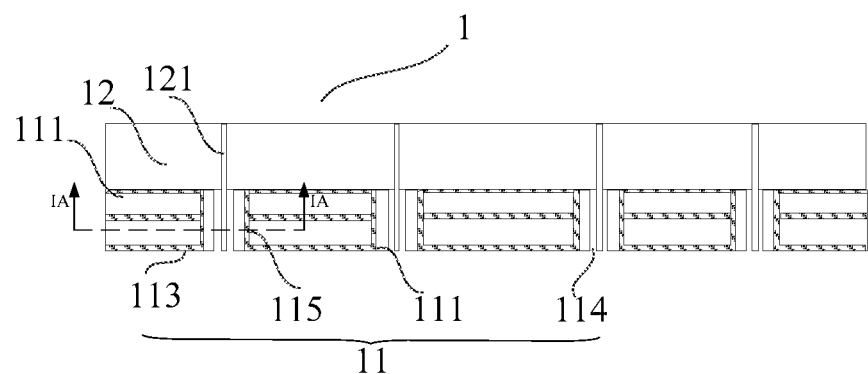
FIG. 1 is a structural schematic view of a cable connection apparatus according to an embodiment of the present disclosure.

In order to enable a skilled person in the art to understand the present disclosure better, the present disclosure will be comprehensively and clearly described by referring to the drawings. Obviously, the drawings show some embodiments, but not all embodiments, of the present disclosure. Other embodiments obtained by the skilled person in the art based on the embodiments of the present disclosure without any creative work, should be included within the scope of the present disclosure.

In the present disclosure, terms of "first", "second", and "third" are used in the specification, claims, and the drawings to distinguish different objects, but not describe a particular order. Further, terms of "include", "have", and any transformation thereof, are used to indicate non-exclusive inclusion. For example, a process method, a system, a product, or a device including a series of operations or units are limited to the listed operations or unit, but may alternatively include other unlisted operations or units, or include operations and units that are inherently included in the process, the method, the product, or the device.

The present disclosure may be illustrated in more details by referring to embodiments and drawings.

As shown in FIG. 1, a structural schematic view of a cable connection apparatus according to an embodiment of the present disclosure is provided. The cable connection apparatus 1 includes a back plate 11 and a connection member 12.

Figure 1A:
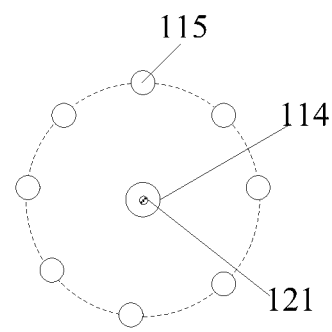
FIG. 1A is a cross sectional view of the cable connection apparatus shown in FIG. 1, taken along a line IA-IA.

The back plate 11 includes a plate body 111 and a ground layer 113. The plate body 111 defines a through hole 114 and a plurality of shielding holes 115. A position of the plate body 111 in which the through hole 114 is defined may correspond to a position of the connection member 12 at which a signal pin 121 is arranged. The plurality of shielding holes 115 are defined adjacent to a wall of the through hole 114, i.e., the plurality of shielding holes are around the through hole 114. FIG. 1a shows a cross section of the plate body 111 taken along the line IA-IA. The plurality of shielding holes 115 are defined along a circumference of the through hole 114. The ground layer 113 is arranged on each of two opposite side faces of the plate body 111 and is connected to a wall of each of the plurality of shielding holes 115. The ground layer 113 may further be arranged in a middle layer of the back plate 11. A metal layer is arranged on an inner side of a wall of the shielding hole 115. The metal layer may be connected to the ground layer 113. As a plurality of electromagnetic fields (such as an induction cooker, a recharger, and so on) may be arranged in an outer space, the metal layer on the inner side of the wall of the shielding hole 115 in the plurality of electromagnetic fields may induce a charge and the electromagnetic fields, such that the signal transmitted through the signal pin 121 in the high speed may be affected. After the metal layer is connected to the ground layer 113, the metal layer on the inner side of the wall of the shielding hole 115 may be conducted with the ground layer 113, such that the charge and the electromagnetic fields may not affect the metal layer, and the signal in the signal pin 121 may be transmitted in the high speed normally. The back plate 11 may be a high-speed PCB.

The connection member 12 may be connected to one of the two opposite side faces of the back plate 11 on which the ground layer 113 is arranged. The signal pin 121 may be arranged in the connection member 12. An end of the signal pin 121 may be protruded from a surface of the connection member 12. The protruded end of the signal pin 121 may be received in the through hole 114. A cross section of the signal pin 121 may be circular. In this way, compared to a conventional pin having a pointed end, the signal pin 121 of the present disclosure may have a rounded end, and a contact area between the rounded end and other components or media may be improved, such that a more firmed connection may be achieved. A diameter of the signal pin 121 may be less than a diameter of the through hole 114. In this way, air may flow between the signal pin 121 and the back plate 11. As a dielectric constant of the air may be greater than a dielectric constant of the back plate 11, the air may effectively reduce a loss of the signal while transmitting through the back plate 11, such that integrity of the high speed signal in the signal pin 121 is maintained. In another embodiment, the connection member 12 may abut against and connect to one of the two opposite side faces of the back plate 11 on which the ground layer 113 is arranged. In still another embodiment, a conductive metal may be arranged between an inner side of a wall of the through hole 114 and an outer wall of the signal pin 121. That is, the inner of the wall of the through hole 114 is metallized. The metallized inner side of the wall of the through hole 114 may clamp the signal pin 121 received in the through hole 114, such that the conductive metal may contact the inner side of the wall of the through hole 114 and the outer side of the wall of the signal pin 121. In this way, the diameter of the signal pin 121 for transmitting the signal is increased, further improving a speed of transmitting the signal.

A side of the connection member 12 having the end of the signal pin 121 protruded may be welded to the back plate 11. It should be noted that, after the signal pin 121 is received in the through hole 114 of the back plate 11, the end of the signal pin 121 being received in the through hole 114 needs to be grinded, such that a surface of the end of the signal pin 121 may align with a surface of a side of the back plate 11 away from the connection member 12. When the end of the signal pin 121 is protruded out of the surface of the back plate 11, unevenness may be caused while welding. When the end of the signal pin 121 is recessed away from the surface of the back plate 11, the end of the signal pin 121 may not be able to connect to other elements.

In the present embodiment, the cable connection apparatus is provided. The signal pin of the connection assembly is received in the through hole in the back plate, such that the signal in the signal pin may be transmitted in the high speed, and the loss of the signal while transmitting through the back plate may be reduced.

Figure 2:
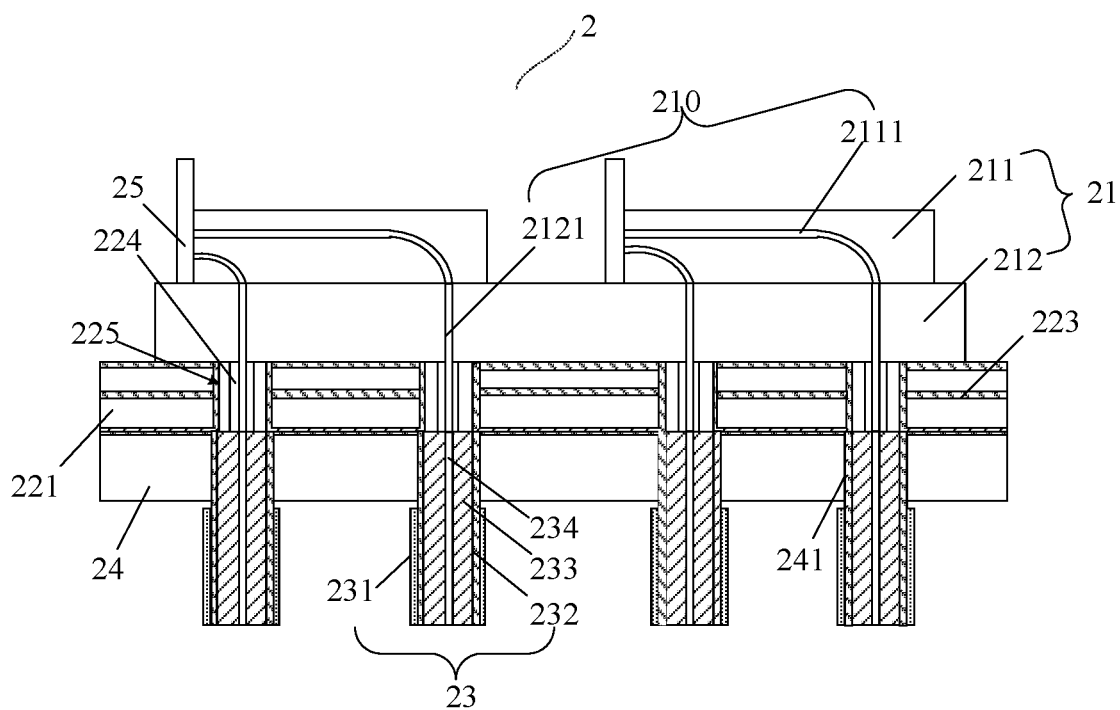
FIG. 2 is a structural schematic view of a connection assembly according to an embodiment of the present disclosure.

As shown in FIG. 2, a structural schematic view of a connection assembly according to an embodiment of the present disclosure is provided. The connection assembly 2 includes a connection member 21, a back plate, a plurality of first cables 23 (shown in the figure), a first fixing member 24, and a high speed daughter card 25.

The back plate may include a plate body 221 and a ground layer 223. The plate body 221 may define a through hole 224 and a plurality of shielding holes 225. A position of the plate body 221 in which the through hole 224 is defined may correspond to a position of the connection member 21 at which a signal pin 210 is arranged. The plurality of shielding holes 225 are defined adjacent to a wall of the through hole 224, i.e., the plurality of shielding holes 225 are around the through hole 224. In detail, the plurality of shielding holes 225 are defined along a circumference of the through hole 224. Two ground layers 223 are arranged two opposite side faces of the plate body 221, and may serve as two pads. One of the two pads is configured to be welded with the connection member 21, and the other one of the two pads is configured to be welded with the first fixing member 24. The two ground layers 223 may be connected to a wall of the shielding hole 225. Another ground layer 223 may be arranged in a middle layer of the back plate. A metal layer is arranged on an inner side of the wall of the shielding hole 225. The metal layer of the shielding hole 225 may be connected to the another ground layer 223. As a plurality of electromagnetic fields (such as an induction cooker, a recharger, and so one) may be arranged in an outer space, the metal layer of the shielding hole 225 in the electromagnetic fields may induce a charge and the electromagnetic fields, such that high speed transmission of the signal in the signal pin 210 may be affected. After the metal layer is connected to the ground layer 223, the metal layer on the inner side of the wall of the shielding hole 225 may be conducted with the ground layer 223, such that the charge and the electromagnetic fields may not affect the metal layer, and the signal may be transmitted through the signal pin 210 in the high speed normally. The back plate may be a high-speed PCB.

The signal pin 210 may be arranged in the connection member 21. An end of the signal pin 210 may be protruded from a first surface of the connection member 21. The first surface of the connection member 21 may be fixedly connected to the back plate. The protruded end of the signal pin 210 may be received in the through hole 224. The high speed daughter card 25 may be arranged on a second surface of the connection member 21 away from the first surface of the connection member 21. The high speed daughter card 25 may be connected to the other end of the signal pin 210. A cross section of the signal pin 210 may be circular. As the signal pin 210 is received in the through hole 224, compared to a conventional pin having a pointed end, the signal pin 210 of the present disclosure has a rounded end, a contact area between the signal pin 210 having the rounded end and other components or media may be increased, and a more firmed connection may be achieved. A diameter of the signal pin 210 may be less than a diameter of the through hole 224. In this way, air may flow between the signal pin 210 and the back plate. As a dielectric constant of the air is greater than a dielectric constant of the back plate, the air may effectively reduce a loss of the signal while transmitting through the back plate, and integrity of the high speed signal in the signal pin 210 may be maintained. In another embodiment, the connection member 21 may abut against a surface of a side of the back plate arranged with the ground layer 223. In still another embodiment, a conductive metal may be arranged between an inner side of the wall of the through hole 224 and an outer side of the signal pin 210. That is, the inner side of the wall of the through hole 224 may be metallized. The metallized inner side of the wall of the through hole 224 may clamp the signal pin 210, such that the conductive metal may contact the inner side of the wall of the through hole 224 and the outer side of the signal pin 210. In this way, a diameter of the signal pin 210 for transmitting the signal may be increased, and the signal may be transmitted in the high speed more fluently.

The plurality of first cables 23 and the first fixing member 24 may be arranged. The first fixing member 24 may be arranged on a side of the back plate away from the connection member 21, and may define a first through hole 241. A position of the first fixing member 24 in which the first through hole 241 is defined may correspond to the position of the back plate in which the through hole 224 is defined. A diameter of the first through hole 241 may be adapted to a diameter of each of the plurality of first cables 23. Each of the plurality of first cables may be received into the first through hole 241 from an end of the first fixing member 24 away from the back plate, and may be fixed by the first fixing member 24. An end of each of the first cables 23 received in the first through hole 241 may be connected to the signal pin 210 in the back plate. In the present embodiment, the first fixing member 24 may be made of metal. The first fixing member 24 may be a rectangular or a circular metal plate. As long as the first fixing member 24 is able to fix the plurality of first cables 23, the present disclosure does not limit a shape of the first fixing member 24. Each of the plurality of first cables 23 may include a central wire 234, a dielectric layer 233 covering the central wire 234, a shielding layer 232 covering the dielectric layer 233, and a protection layer 231 covering the shielding layer 232. In the present embodiment, each of the plurality of first cables 23 may include a first portion and a second portion. The first portion may be a portion received in the first through hole 241. The second portion may be a portion out of the first through hole 241. In the present embodiment, in order to achieve an effective electric conductivity between the shielding layer 232 and the first fixing member 24, the wall of the first through hole 241 is required to contact the shielding layer 232. That is, when the first portion of each of the plurality of first cables 23 is received in the first through hole 241, a portion of the protection layer 231 covering the first portion may be eliminated, such that a portion of the shielding layer 232 may be exposed. In order to improve a firm connection between each of the plurality of first cables 23 and the first fixing member 24, the inner diameter of the first through hole 241 may be adapted to the outer diameter of the shielding layer 232.

In another embodiment, the connection member 21 may include a first connection member 211 and a second connection member 212. The first connection member 211 may be arranged with a first signal pin 2111. A first end of the first signal pin 2111 may be exposed on a first surface of the first connection member 211, and a second end of the first signal pin 2111 may be exposed on a second surface of the first connection member 211. The high speed daughter card 25 may be fixedly connected to the first surface of the first connection member 211. The second connection member 212 may be arranged with a second signal pin 2121. A first end of the second signal pin 2121 may be exposed on a first surface of the second connection member 212, and a second end of the second signal pin 2121 may be protruded from a second surface of the second connection member 212. The first surface of the second connection member 212 exposing the second signal pin 2121 may be connected to or abut against the second surface of the first connection member 211 exposing the second end of the first signal pin 2111. The second surface of the second connection member 212 having the second end of the second signal pin 2121 protruded may be fixedly connected to the surface of the side of the back plate arranged with the ground layer 223. The protruded end, i.e., the second end, of the second signal pin 2121 may extend through the through hole 224, and the second signal pin 2121 may be connected to the first signal pin 2111. The first surface of the first connection member 211 exposing the first end of the first signal pin 2121 may be connected to the high speed daughter card 25. The first signal pin 2121 may be connected to the high speed daughter card 25. In the present embodiment, a plurality of high speed daughter cards 25 are arranged to connect to the first connection member 211, and a plurality of first signal pins 2111 may be arranged in the first connection member 211. In order to allow the plurality of high speed daughter cards 25 to be arranged on the back plate neatly, the plurality of first signal pins 2111 in the first connection member 211 connected to the plurality of high speed daughter cards 25 may be bent. That is, the first and the second ends of the first signal pin 2111 may be exposed on two adjacent surfaces of the first connection member 211. The high speed daughter card 25 may be arranged to extend perpendicular to the back plate.

The present embodiment provides a connection assembly. The signal pin of the connection member may be received in the through hole in the back plate, such that the signal in the signal pin may be transmitted in the high speed through a first cable. The first cable may be connected to the signal pin of the connection member through the first fixing member in the connection assembly. As the first cable is connected to the signal pin through the first fixing member, when a plurality of the first cables are arranged, the fixing member may be arranged to prevent the plurality of first cables from falling off. Further, the first fixing member of the present embodiment has a simple structure, compared to a conventional connection member, the manufacturing cost may be reduced, and application reliability may be improved.

Figure 3:
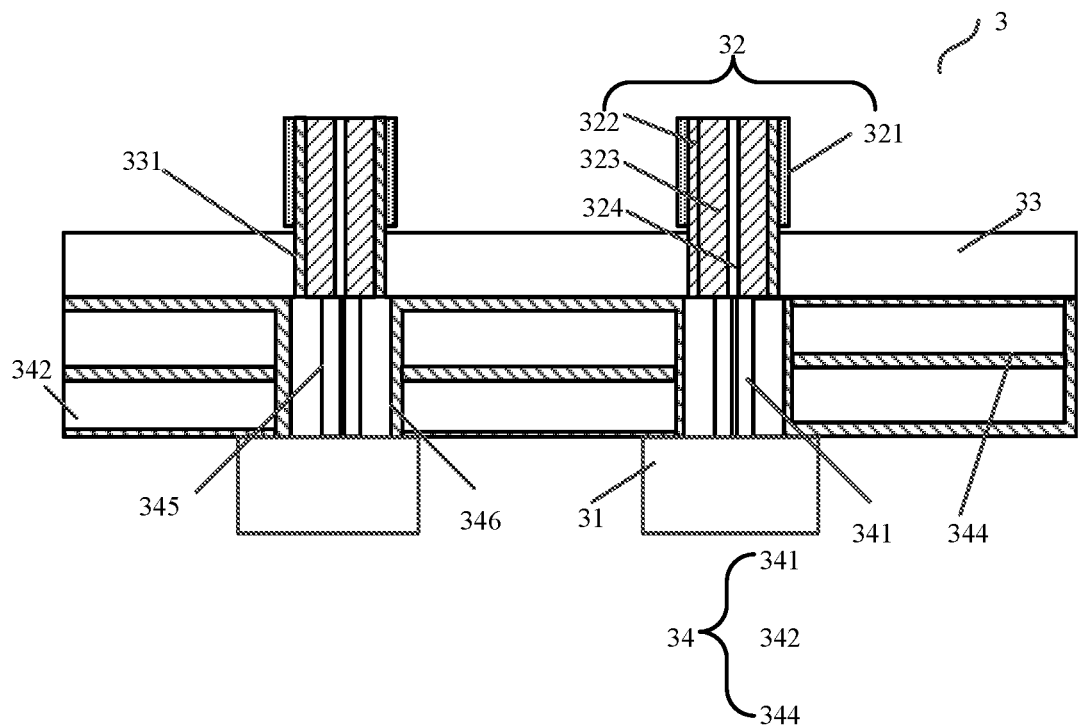
FIG. 3 is a structural schematic view of a high-speed daughter card in a connection assembly according to an embodiment of the present disclosure.
Figure 4:
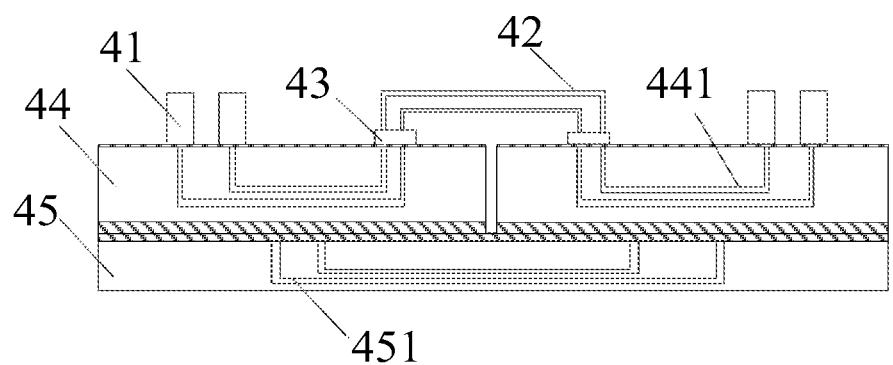
FIG. 4 is a structural schematic view of a high-speed daughter card in a connection assembly according to another embodiment of the present disclosure.

FIG. 3 shows a structural schematic view of a high-speed daughter card in a connection assembly according to an embodiment of the present disclosure. FIG. 4 shows a structural schematic view of a high-speed daughter card in a connection assembly according to another embodiment of the present disclosure.

The high speed daughter card 3 may include a high speed element 31, a second cable 32, a first circuit board 34, and a second fixing member 33.

The first circuit board 34 may include a body portion 342 and a ground layer 344. The first circuit board 34 may include a first signal line 341. A plurality of shielding holes 346 may be defined along and adjacent to a circumference of the first signal line 341. An inner side of a wall of the shielding hole 346 may be connected to the ground layer 344 of the first circuit board 34. A side of the first circuit board 34 arranged with the ground layer 344 may be welded with the second fixing member 33 and the high speed element 31. In the present embodiment, two ground layers are arranged on two opposite sides of the first circuit board 34. The second fixing member 33 may be arranged on one of the two opposite sides, and the high speed element 31 may be arranged on the other one of the two opposite sides. The inner side of the wall of the shielding hole 346 may be metallized, i.e., a metal layer may be arranged on the inner side of the wall of the shielding hole 346. As a plurality of electromagnetic fields (such as an electromagnetic cooker, a recharger, and the like) are arranged in an outer space, the metal layer configured for metallizing the inner side of the wall of the shielding hole 346 in the electromagnetic fields may induce a charge and the plurality of electromagnetic fields, transmitting the signal through the first signal line 341 may be affected. After the metal layer is connected to the ground layer 344, the metal layer may be conducted to the ground layer 344, and may not be affected by the charge or the plurality of electromagnetic fields, such that integrity of the high speed signal in the first signal line 341 may be maintained. The first circuit board 34 may be a high speed PCB board.

The second fixing member 33 may be arranged on a side of the first circuit board 34 and define a second through hole 331. A position of the second fixing member 33 in which the second through hole 331 is defined may correspond to the position of the first circuit board 34 at which the first signal line 341 is arranged. A diameter of the second through hole 331 may be adapted to a diameter of the second cable 32. The second cable 32 may be received in the second through hole 331 from a side of the second fixing member 33 away from the first circuit board 34, and may be fixed by the second fixing member 33. An end of the second cable 32 received in the second through hole 331 may be connected to an end of the first signal line 341 in the first circuit board. The other end of the signal line 341 in the first circuit board 34 may be connected to the high speed element 31. In the present embodiment, the second fixing member 33 may be made of metal. The second fixing member 33 may be a rectangular or a circular metal plate. As long as the second fixing member 33 is able to fix the second cable 32, the present disclosure does not limit a shape of the second fixing member 33. The second cable 32 may include a central wire 324, a dielectric layer 323 covering the central wire 324, a shielding layer 322 covering the dielectric layer 323, and a protection layer 321 covering the shielding layer 322. In the present embodiment, the second cable 32 may include a first portion and a second portion. The first portion may be a portion received in the second through hole 331. The second portion may be a portion out of the second through hole 331. In the present embodiment, in order to achieve an effective electric conductivity between the shielding layer 322 and the second fixing member 33, an inner side of the wall of the second through hole 331 is required to contact the shielding layer 332. That is, when the first portion of the second cable 32 is received in the second through hole 331, a portion of the protection layer 321 covering the first portion may be eliminated, such that a portion of the shielding layer 322 may be exposed. In order to improve firm connection between the second cable 32 and the second fixing member 33, an inner diameter of the second through hole 331 may be adapted with an outer diameter of the protection layer 322 (as shown in FIG. 3).

In another embodiment, as shown in FIG. 4, the high speed daughter card may include a second circuit board 45, a plurality of first circuit boards 44, and a plurality of high speed elements 41. The plurality of high speed elements 41 may be arranged on a side of each of the plurality of first circuit boards 44. The second circuit board 45 may be arranged with a second signal line 451. The second circuit board 45 may be connected to another side of each of the plurality of first circuit boards 44 away from the plurality of high speed elements 41. The second signal line 451 may be connected to various first circuit boards 44, i.e., two ends of the second signal line 451 may be connected to two of the plurality of first circuit boards 44. In this way, high speed transmission of the signal between various high speed elements 41 in the high speed daughter card may be achieved. The second circuit board 45 may be a low speed board. Each of the plurality of first circuit boards 44 may be arranged with a first signal line 441 and a second cable 42. The first signal line 441 and the second cable 42 may be configured to transmit the high speed signal between high speed elements 41. The second signal line 451 may be configured to transmit a low speed signal between the high speed elements 41.

Figure 5:
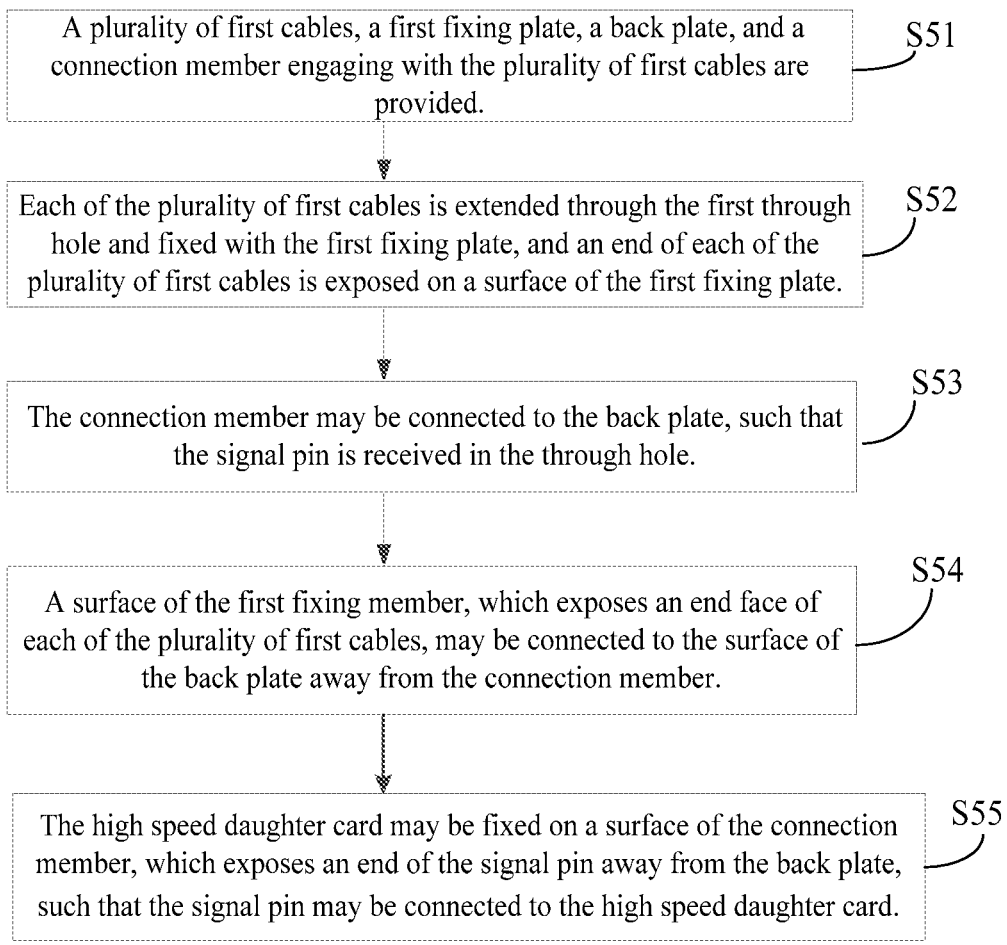
FIG. 5 is a flow chart of a method for manufacturing a connection assembly according to an embodiment of the present disclosure.

As shown in FIG. 5, a flow chart of a method for manufacturing a connection assembly according to an embodiment of the present disclosure is provided.

In an operation S51, a plurality of first cables, a first fixing plate, a back plate, and a connection member engaging with the plurality of first cables are provided.

In detail, each of the plurality of first cables is a coaxial cable. Each of the plurality of first cables includes a central wire, a dielectric layer surrounding the central wire, a shielding layer surrounding the dielectric layer, and a protection layer surrounding the shielding layer. The shielding layer may be a metal shielding layer. In the present embodiment, the connection member is arranged with a signal pin. The signal pin is exposed on a surface of the connection member. The back plate defines a through hole and is arranged with a ground layer. The first fixing plate defines a first through hole.

In an operation S52, each of the plurality of first cables is extended through the first through hole and fixed with the first fixing plate, such that an end of each of the plurality of first cables is exposed on a surface of the first fixing plate.

A portion of the protection layer surrounding the end of each of the plurality of first cables is eliminated, such that a portion of the shielding layer of each of the plurality of first cables is exposed. An end of each of the plurality of first cables having the exposed portion of the shielding layer is received in the first through hole, and a surface of the end of each of the plurality of first cables aligns with a first surface of the first fixing member. An electroconductive adhesive is arranged at a periphery of each of the plurality of first cables on a second surface of the first fixing member, such that each of the plurality of first cables is fixed in the first fixing member. Each of the plurality of first cables on the first surface of the first fixing member may be grinded, such that a side of the first fixing member close to the back plate may be flat.

In detail, in order to achieve an effective electric conductivity between the shielding layer of each of the plurality of first cables and the first fixing member, a portion of the protection layer surrounding the end of each of the plurality of first cables is eliminated, such that a portion of the shielding layer is exposed. The end of each of the plurality of first cables having the portion of the protection layer eliminated is received in the first through hole, such that the portion of the shielding layer contacts the first fixing member. As each of the plurality of first cables is required to be fixed with the connection member and connect to the signal pin in the connection member after being received in the first through hole, the surface of the end of each of the plurality of first cables after being received in the first through hole is required to align with the first surface of the first fixing member, and the end of each of the plurality of first cables should not be recessed from the first surface. In order to improve fixation between each of the plurality of first cables and the first fixing member, and to prevent each of the plurality of first cables from falling off, when each of the plurality of first cables is received in the first through hole, the electroconductive adhesive may be arranged on a side of the first fixing member away from the back plate and at a periphery of a wall of the first through hole. Alternatively, high temperature soldering may be performed on the side of the first fixing member away from the back plate and at a periphery of wall of the first through hole. In this way, each of the plurality of first cables maybe fixed. In another embodiment, a layer of electroconductive adhesive may be coated on the shielding layer. After each of the plurality of first cables is received in the second through hole, each of the plurality of first cables may be fixed by arranging the electroconductive adhesives or performing high temperature soldering on the periphery of the first through hole. In order to achieve flatness of the first surface of the first fixing member, after each of the plurality of first cables is fixed with the first fixing member, the end of each of the plurality of first cables received in the first through hole may be grinded, such that the surface of the end of each of the plurality of first cables and the first surface of the fixing member may be aligned. It should be noted that, in a process of grinding, the central wire of each of the plurality of first cables may be completely exposed.

In the present embodiment, in order to prevent the signal from being affected by an electromagnetic wave generated by signal transmission through the plurality of first cables, an effective electric conductivity between the shielding layer of each of the plurality of first cables and the first fixing member may be achieved. Therefore, the inner diameter of the first through hole may be adapted to the outer diameter of the shielding layer of each of the plurality of first cables.

In an operation S53, the connection member may be connected to the back plate, such that the signal pin is received in the through hole.

In detail, a plurality of shielding holes are defined in the back plate. The plurality of shielding hole are defined adjacent to and along a wall of the through hole. An inner side of a wall of each of the plurality of shielding holes may be metallized, and the metallized inner side of the wall of each of the plurality of shielding holes may be connected to the ground layer of the back plate. Two surfaces of the back plate may be coated with gold to form two ground layers on the back plate. The two ground layers are formed on an upper surface and a lower surface of the back plate and may serve as two pads. The two ground layers may be connected to the metallized inner side of the wall of each of the plurality of shielding layers. A surface of the back plate between the through hole and the shielding hole may not be coated with the gold. The connection member may be arranged on an upper side of the back plate. A surface of the connection member exposing the end of the signal pin may be placed close to the back plate. The signal pin exposed from the surface of the connection member may be received in the through hole of the back plate. In this way, the surface of the connection member may be welded with the surface of the back plate. After the signal pin is received in the through hole of the back plate, the end of the signal pin received in the through hole may be grinded, such that a surface of the end of the signal pin and a surface of the back plate away from the connection member may be aligned.

In another embodiment, after the signal pin is received in the through hole, an electric conductive metal may be arranged in a gap between the signal pin and wall of the through hole, and the gap may be filled with the electric conductive metal. In this way, the electric conductive metal may be connected to the inner side of the wall of the through hole and the outer side of the signal pin, and a surface of the filled electric conductive metal and an end surface of the signal pin in the through hole may be aligned.

In an operation S54, a surface of the first fixing member, which exposes an end face of each of the plurality of first cables, may be connected to the surface of the back plate away from the connection member.

In detail, the surface of the first fixing member, which exposes the end face of each of the plurality of first cables, may be disposed to face towards the back plate, such that the central wire of the exposed end of each of the plurality of first cables may correspond to the signal pin in the through hole of the back plate. A soldering operation may be performed to solder the first fixing member, which is fixed with each of the plurality of first cables, with the surface of the back plate away from the connection member.

In an operation S55, the high speed daughter card may be fixed on a surface of the connection member, which exposes an end of the signal pin away from the back plate, such that the signal pin may be connected to the high speed daughter card.

In detail, the high speed daughter card may be crimped and fixed with the connection member. It should be noted that, while crimping and fixing, the high speed daughter card may be connected to the end of the signal pin of the connection member away from the back plate.

In another embodiment, the connection member may include a first connection member and a second connection member. The second connection member may be arranged with a second signal pin. A first end of the second signal pin is exposed on a surface of the second connection member, and a second end of the second signal pin is protruded from another surface of the second connection member. A diameter of the second signal pin may be less than the diameter of the through hole. The first connection member may be arranged with a first signal pin, and a first end the first signal pin is exposed on a surface of the first connection member, a second end of the first signal pin is exposed on another surface of the first connection member. The protruded end, i.e., the second end, of the second signal pin of the second connection member is received in the through hole of the back plate. The first connection member is fixedly crimped with the high speed daughter card. The first end of the first signal pin is connected to the high speed daughter card. The another surface of the first connection member, which exposes the second end of the first signal pin, is connected to a surface of the second connection member away from the back plate. It should be noted that, the second end of the first signal pin is connected to the first end of the second signal pin. The high speed daughter card is fixedly connected to the back plate through the first connection member and the second connection member.

The present embodiment provides a method for manufacturing the connection assembly. The signal pin of the connection member is received in the through hole in the back plate, such that the signal in the signal pin may be transmitted in a high speed through a first cable. The first cable may be connected to the signal pin of the connection member through the first fixing member of the connection assembly. When a plurality of first cables are arranged, arranging the first fixing member may prevented the plurality of first cables from falling off. Further, as the first fixing member has a simple structure, compared to a conventional special connection member, a manufacturing cost of the present embodiment may be reduced, and application reliability may be improved.

Figure 6:
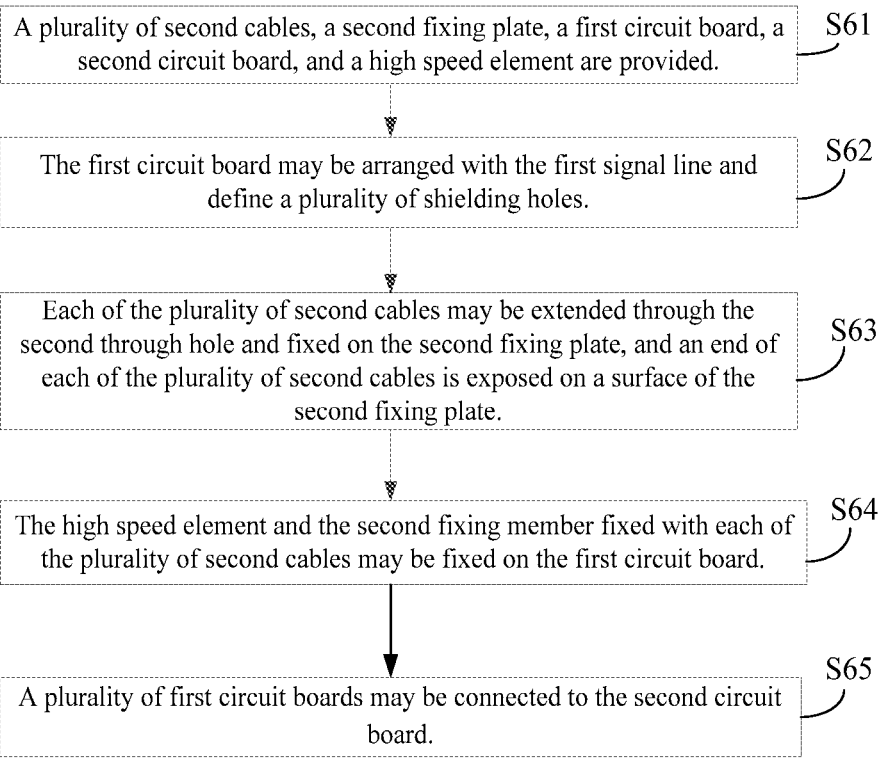
FIG. 6 is a flow chart of a method for manufacturing a high-speed daughter card in a connection assembly according to an embodiment of the present disclosure.

As shown in FIG. 6, a flow chart of a method for manufacturing a high-speed daughter card in a connection assembly according to an embodiment of the present disclosure is provided. The present embodiment shows a method for manufacturing a connection structure of the high speed daughter card shown in the above embodiment.

In an operation S61, a plurality of second cables, a second fixing plate, a first circuit board, a second circuit board, and a high speed element are provided.

In detail, the plurality of second cables and the plurality of first cables may have similar structures, but may be in different sizes. The plurality of second cables may be coaxial cables. Each of the plurality of second cables may include a central wire, a dielectric layer surrounding the central wire, a shielding layer surrounding the dielectric layer, and a protection layer surrounding the shielding layer. The shielding layer may be a metal shielding layer.

In the present embodiment, the first circuit board may be arranged with a first signal line. Two ends of the first signal line may be exposed on two surfaces of the first circuit board. The first circuit board may be arranged with a ground layer. The first circuit board may be a high speed board, and the second circuit board may be a low speed board. The second circuit board may be arranged with a second signal line. The second fixing plate may define a second through hole.

In an operation S62, the first circuit board may be arranged with the first signal line and define a plurality of shielding holes.

In detail, a surface of the first circuit board may define two openings, and the two openings may communicate with each other, such that a channel may be defined in the first circuit board. An inner side of a wall of the channel may be metallized, such that the metallized inner side of the wall of the channel may be conducted to elements arranged at the two openings of the channel, and a hollowed first signal line may be formed. The plurality of shielding holes may be defined adjacent to and along a circumference periphery of the first signal line, such that the first signal line may be an axis of the plurality of shielding holes. Walls of the plurality of shielding holes may be metallized, such that the metallized walls may be connected to the ground layer in the first circuit board. An upper surface and a lower surface of the first circuit board may be coated with gold, such that two ground layers may be formed on the upper surface and the lower surface of the first circuit board. The two ground layers may serve as two pads. The two ground layers may be connected to an end of a wall of each of the plurality of shielding holes. A surface of the first circuit board between the shielding hole and each of the two ends of the channel are not coated with the gold.

In another embodiment, in order to ensure the first signal line in the first circuit board to conduct components arranged at the two ends of the channel, an electroconductive metal may be received in the channel having the metallized wall, such that the through hole is filled with the electroconductive metal. The electroconductive metal may be exposed from the two ends of the channel, a surface of the electroconduction metal may be aligned with the surface of the first circuit board. In this way, a solid first signal line may be formed.

In an operation S63, each of the plurality of second cables may be extended through the second through hole and fixed on the second fixing plate, such that an end of each of the plurality of second cables is exposed on a surface of the second fixing plate.

A portion of the outer protection layer covering an end of each of the plurality of second cables is eliminated, such that a portion of the shielding layer of the end of each of the plurality of second cables is exposed. The end of each of the plurality of second cables, which has the portion of the shielding layer exposed, is received in the second through hole, and a surface of the end of each of the plurality of second cables aligns with a first surface of a second fixing member. An electroconductive adhesive may be arranged at a periphery of each of the plurality of second cables on a second surface of the second fixing member opposite to the first surface, such that each of the plurality of second cables may be fixed with the second fixing member. Each of the plurality of second cables on the first surface of the second fixing member is grinded, such that a surface of the second fixing member close to the first circuit board may be flat.

In detail, in order to achieve an effective electric conductivity between the shielding layer of each of the plurality of second cables and the second fixing member, a portion of the protection layer arranged at the end of each of the plurality of second cables is eliminated, such that a portion of the shielding layer is exposed. The end of each of the plurality of second cables having the portion of the protection layer eliminated is received in the second through hole, such that the portion of the shielding layer contacts the second fixing member. As each of the plurality of second cables is required to be fixed with the first circuit board after being received in the second through hole, a surface of the end of each of the plurality of second cables is required to align with the first surface of the second fixing member, and should not be recessed from the first surface of the second fixing member. In order to ensure fixation between each of the plurality of second cables and the second fixing member, and prevent each of the plurality of second cables from falling off, after each of the plurality of second cables is received in the second through hole, the electroconductive adhesive may be arranged on the second surface of the second fixing member close each of the plurality of second cables and at the periphery of each of the plurality of second cables. Alternatively, high temperature soldering may be performed on the second surface of the second fixing member close each of the plurality of second cables and at the periphery of each of the plurality of second cables. In this way, the plurality of second cables are fixed. In another embodiment, a layer of electroconductive adhesive is coated on the shielding layer. After being received in the second through hole, each of the plurality of second cables may be fixed by arranging the electroconductive adhesive or performing high temperature soldering at the periphery of each of the plurality of second cables. In order to achieve a flat surface on which the second fixing member and the first circuit board are connected, after each of the plurality of second cables is fixed with the second fixing member, the end of each of the plurality of second cables received in the second through hole may be grinded, such that the surface of the end of each of the plurality of second cables may align with the first surface of the second fixing member. It should be noted that, in the process of grinding, the central wire of each of the plurality of second cables may be completely exposed.

In the present embodiment, in order to prevent the signal from being affected by the electromagnetic wave generated while transmitting the signal through the plurality of second cables, an effective conductivity between the shielding layer of each of the plurality of second cables and the second fixing member is required. Therefore, an inner diameter of the second through hole may be adapted with an outer diameter of the shielding layer of each of the plurality of second cables.

In an operation S64, the high speed element and the second fixing member fixed with each of the plurality of second cables may be fixed on the first circuit board.

In detail, the two ends of the first signal line in the first circuit board may be exposed on a same surface of the first circuit board. The high speed element may be arranged above the first circuit board, and may be fixed on the first circuit board by crimping, such that an end of the first signal line exposed on the first circuit board may be connected to the high speed element. The second fixing member fixed with each of the plurality of second cables may be arranged on the first circuit board, and the surface of the second fixing member exposing the end of each of the plurality of second cables, i.e., the first surface of the second fixing member, may be arranged to face towards the first circuit board, such that the central wire of the exposed end of each of the plurality of second cables may correspond to the end of the first signal line in the first circuit board. Soldering may be performed to solder the first fixing member, which is fixed with each of the plurality of first cables, with the ground layer of the second circuit board. A plurality of high speed elements may be connected through the plurality of second cables, such that high speed transmission of signals may be achieved.

In another embodiment, the first signal line in the first circuit board may extend through the first circuit board. The two ends of the first signal line may be exposed on an upper surface and a lower surface of the first circuit board respectively. The high speed element may be arranged and fixed on the first circuit board by crimping, such that an end of the first signal line exposed on the upper surface of first circuit board may be connected to the high speed element. The first surface of the second fixing member, which is fixed with a second cable, exposing the end of the second cable may be arranged to face towards a bottom face of the first circuit board, such that the central wire of the exposed end of the second cable may correspond to the end of the first signal line exposed on the lower surface of the first circuit board. Soldering may be performed to solder the first fixing member, which is fixed with the second cable, with the ground layer of the second circuit board away from the high speed element.

In an operation S65, a plurality of first circuit boards may be connected to the second circuit board.

In detail, the plurality of first circuit boards may be arranged on the second circuit board. Soldering may be performed to fix the plurality of first circuit boards on the second circuit board. It should be noted that, two ends of the second signal line in the second circuit board may be connected two first circuit boards.

The present embodiment provides a method for manufacturing the high speed daughter card. Each of plurality of second cables may be fixed with the second fixing member. Subsequently, the high speed element and the second fixing member, which is fixed with each of plurality of second cables, may be soldered and fixed on the first circuit board. At last, a plurality of first circuit boards may be fixed on the second circuit board by soldering. In this way, a plurality of high speed elements may be connected through the plurality of second cables, high speed transmission of signals between high speed elements may be achieved. The plurality of first circuit boards may be supported by the second circuit board, such that various high speed elements may be connected, and low speed signals between the various high speed elements may be transmitted. Each of the plurality of second cables may be fixed on the first circuit board through the second fixing member. In this way, connection strength between each of plurality of second cables and the first circuit board may be improved, such that each of plurality of second cables may not be fallen off from the first circuit board. The high speed daughter card may have a simple structure, a manufacturing cost may be reduced, and practicability may be improved.

The above description shows embodiments of the present disclosure only, but does not limit the scope of the present disclosure. Any equivalent structural or process transformation performed based on the specification and the drawings of the present disclosure, directly or indirectly applied in the related art, should also be included within the scope of the present disclosure.

What is claimed is:

1. A cable connection apparatus, comprising:
   a back plate, comprising a plate body and a ground layer, wherein the plate body defines a through hole and a plurality of shielding holes, the plurality of shielding holes are defined around the through hole, the ground layer is arranged on each of two opposite sides of the plate body and is connected to a wall of each of the plurality of shielding holes; and
   a connection member, arranged to abut against or connect to one of the two opposite sides of the back plate arranged with the ground layer, wherein the connection member is arranged with a signal pin, and a portion of the signal pin is received in the through hole.

2. The cable connection apparatus according to claim 1, wherein a metal layer is arranged on the wall of each of the plurality of shielding holes, and the metal layer of each of the plurality of shielding holes is connected to the ground layer.

3. The cable connection apparatus according to claim 1, wherein a metal layer is arranged on a wall of the through hole, and the metal layer on the wall of the through hole is configured to clamp the portion of the signal pin received in the through hole.

4. The cable connection apparatus according to claim 1, wherein an end surface of the portion of the signal pin received in the through hole is aligned with a surface of the back plate away from the connection member.

5. The cable connection apparatus according to claim 1, wherein another ground layer is arranged in a middle of the plate body and is connected to the wall of each of the plurality of shielding holes.

6. A connection assembly, comprising:
a high speed daughter card;
a connection member, arranged with a signal pin, wherein a side of the connection member is fixedly connected to the high speed daughter card, and the signal pin is connected to the high speed daughter card;
a back plate, arranged on a side of the connection member away from the high speed daughter card, wherein the back plate comprises a plate body and a ground layer, the plate body defines a through hole and a plurality of shielding holes, the plurality of shielding holes are defined around the through hole, and the ground layer is arranged on each of two opposite sides of the plate body and is connected to a wall of each of the plurality of shielding holes; and
a plurality of first cables and a first fixing member, wherein
the first fixing member is arranged on a side of the back plate, the first fixing member defines a first through hole corresponding to the through hole in the back plate, a diameter of the first through hole is adapted to a diameter of each of the plurality of first cables;
the plurality of first cables are fixed with the first fixing member, an end of each of the plurality of first cables is exposed on a surface of the first fixing member;
the exposed end of each of the plurality of first cables is connected to the signal pin;
the side of the connection member away from the high speed daughter card is arranged to abut against or connect to one of the two opposite sides of the back plate arranged with the ground layer; and
a portion of the signal pin is received in the through hole.

7. The connection assembly according to claim 6, wherein the connection member comprises a first connection member and a second connection member;
the first connection member is arranged with a first signal pin, a first end of the first signal pin is exposed on a first surface of the first connection member, a second end of the first signal pin is exposed on a second surface of the first connection member, the first surface of the first connection member exposing the first end of the first signal pin is fixedly connected to the high speed daughter card;
the second connection member is arranged with a second signal pin, a first end of the second signal pin is exposed on a first surface of the second connection member, a second end of the second signal pin is protruded from a second surface of the second connection member;
the first surface of the second connection member is arranged to abut against or connect to the second surface of the first connection member exposing the second end of the first signal pin;
the second surface of the second connection member having the second end of the second signal pin protruded is fixedly connected to one of the two opposites sides of the back plate arranged with the ground layer;
the protruded second end of the second signal pin is extended through the through hole;
the second signal pin is connected to the first signal pin; and
the first signal pin is connected to the high speed daughter card.

8. The connection assembly according to claim 7, wherein the first signal pin is bent, and the first surface of the first connection member, which exposes the first end of the first signal pin, and the second surface of the first connection member, which exposes the second end of the first signal pin, are two adjacent surfaces.

9. The connection assembly according to claim 6, wherein
a metal layer is arranged on the wall of each of the plurality of shielding holes;
one of the two opposite sides of the back plate arranged with the ground layer is a side of the back plate close to the first fixing member;
the ground layer arranged on the side of the back plate close to the first fixing member is connected to the metal layer;
each of the plurality of first cables has a central wire; and
the first fixing member is welded on the ground layer arranged on the back plate, and the central wire of each of the plurality of first cables is fixedly connected to the signal pin.

10. The connection assembly according to claim 6, wherein
each of the plurality of first cables further comprises a shielding layer covering the central wire and a protection layer covering the shielding layer;
a portion of the protection layer is eliminated, and a portion of the shielding layer is exposed; and
a portion of each of the plurality of first cables is received in and extended through the first through hole, and the exposed portion of the protection layer is arranged to directly contact a wall of the first through hole.

11. The connection assembly according to claim 6, wherein
the high speed daughter card comprises a high speed element, a second cable, a first circuit board, and a second fixing member;
the first circuit board is arranged with a first signal line, a plurality of barrier holes are defined adjacent to and along a periphery of the first signal line, the second fixing member and the high speed element are fixed on the first circuit board;
the second fixing member defines a second through hole corresponding to the first signal line, a diameter of the second through hole is adapted to a diameter of the second cable, the second cable is fixedly received in the second through hole; and
an end of the first signal line is connected to the second cable through the second fixing member, the other end of the first signal line is connected to the high speed element, and the first circuit board is a high speed board.

12. The connection assembly according to claim 11, wherein the high speed daughter card further comprises a second circuit board;

a plurality of first circuit boards are arranged on the second circuit board;

the second circuit board is arranged with a second signal line, the second circuit board is connected to a side of each of the plurality of first circuit boards away from the high speed element;

two ends of the second signal line are connected to two of the plurality of first circuit boards; and the second circuit board is a low speed board.

13. The connection assembly according to claim 11, wherein an end surface of the second cable is aligned with a surface of the second fixing member exposing an end of the second cable.

14. The connection assembly according to claim 6, wherein a cross section of the signal pin is circular, the portion of the signal pin received in the through hole is connected to a central wire of each of the plurality of first cables.

15. The connection assembly according to claim 6, wherein a gap is defined between an outer side of the signal pin and the wall of the through hole; and a metal is received in the gap, and the gap is filled with the metal.

16. A method for manufacturing a connection assembly, comprising:

providing a plurality of first cables, a first fixing plate, a back plate, and a connection member engaging with the plurality of first cables, wherein the connection member is arranged with a signal pin, the back plate defines a through hole and is arranged with a ground layer, the first fixing plate defines a first through hole;

arranging each of the plurality of first cables to extend through the first through hole, fixing each of the plurality of first cables with the first fixing plate, wherein an end of each of the plurality of first cables is exposed on a first surface of the first fixing plate;

connecting the connection member with the back plate to enable an end of the signal pin protruded from the connection member to be received in the through hole;

connecting the first surface of the first fixing plate with a surface of the back plate away from the connection member; and fixing the high speed daughter card on a surface of the connection member exposing the other end of the signal pin to enable the signal pin to connect to the high speed daughter card.

17. The method for manufacturing a connection assembly according to claim 16, wherein the arranging each of the plurality of first cables to extend through the first through hole, fixing each of the plurality of first cables with the first fixing plate, comprises:

eliminating a portion of an outer protection layer arranged on each of the plurality of first cables to expose a portion of a shielding layer of each of the plurality of first cables;

receiving an end of each of the plurality of first cables having the portion of the shielding layer exposed in the first through hole, aligning a surface of the end of each of the plurality of first cables with the first surface of the first fixing plate;

arranging an electroconductive adhesive on a second surface of the first fixing plate at a periphery of each of the plurality of first cables, wherein each of the plurality of first cables is fixed in the first fixing plate, and the second surface is opposite to the first surface; and grinding the end of each of the plurality of first cables protruding from the first surface of the first fixing plate, wherein a side of the first fixing plate close to the back plate is flat.

18. The method for manufacturing a connection assembly according to claim 16, wherein the connection member comprises a first connection member and a second connection member, the second connection member is arranged with a second signal pin, the second signal pin is exposed on a surface of the second connection member, a diameter of the second signal pin is less than a diameter of the through hole, the first connection member is arranged with a first signal pin, the first signal pin is exposed on a surface of the first connection member;

the connecting the connection member with the back plate to enable an end of the signal pin protruded from the connection member is received in the through hole comprises:

defining a plurality of shielding holes on the back plate, wherein the plurality of shielding holes are defined adjacent to and along a wall of the through hole;

metallizing an inner side of a wall of each of the plurality of shielding holes, connecting the inner side of the wall of each of the plurality of shielding holes with the ground layer arranged on the back plate; and arranging the second connection member above the back plate to enable an end of the second signal pin to be received in the through hole; and the fixing the high speed daughter card on the surface of the connection member exposing the other end of the signal pin to enable the signal pin to connect to the high speed daughter card, comprises:

crimping the high speed daughter card with the first connection member to fix the high speed daughter card onto the first connection member, wherein the high speed daughter card is connected to an end of the first signal pin; and plugging the first connection member with the second connection member to connect the other end of the first signal pin with the second signal pin.

19. The method for manufacturing a connection assembly according to claim 18, wherein the arranging the second connection member above the back plate to enable an end of the second signal pin to be received in the through hole, comprises:

arranging a metal in a gap between the wall of the through hole and an outer side of the end of the second signal pin received in the through hole, wherein the gap is filled by the metal.

20. The method for manufacturing a connection assembly according to claim 16, wherein the connecting the first surface of the first fixing plate with the surface of the back plate away from the connection member, comprises:

grinding a surface of the through hole away from the connection member, wherein the end of the signal pin received in the through hole is protruded from the surface of the through hole away from the connection member; and arranging the first fixing plate below the back plate, connecting the end of each of the plurality of first cables received in the through hole to the signal pin.

* * * * *